US006160454A

United States Patent [19]

Buer et al.

[11] Patent Number: 6,160,454
[45] Date of Patent: *Dec. 12, 2000

[54] EFFICIENT SOLID-STATE HIGH FREQUENCY POWER AMPLIFIER STRUCTURE

[75] Inventors: Kenneth V. Buer, Gilbert; Dean L. Cook; Richard Torkington, both of Mesa; Edwin J. Stanfield, Queen Creek; Phillip James Denisuk, Chandler, all of Ariz.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 09/175,037

[22] Filed: Oct. 19, 1998

[51] Int. Cl.[7] ................................ H03F 3/68; H03F 3/14; H01P 5/12

[52] U.S. Cl. ........................... 330/295; 330/307; 333/137

[58] Field of Search ..................................... 330/286, 295, 330/307; 333/125, 128, 136, 137, 26

[56] References Cited

U.S. PATENT DOCUMENTS

| | | | |
|---|---|---|---|
| 4,291,278 | 9/1981 | Quine | 330/286 |
| 4,647,869 | 3/1987 | Kaneko et al. | 330/286 |
| 4,677,393 | 6/1987 | Sharma | 330/286 |
| 5,329,248 | 7/1994 | Izadian | 330/295 |
| 5,497,050 | 3/1996 | Cheo | 330/295 |
| 5,561,397 | 10/1996 | Kumar et al. | 330/295 |
| 5,838,201 | 11/1998 | Sechi | 330/286 |

FOREIGN PATENT DOCUMENTS

| | | | |
|---|---|---|---|
| 0102686 | 5/1983 | European Pat. Off. . | |
| 0603928 | 12/1993 | European Pat. Off. | H01L 21/58 |
| 9801946 | 7/1997 | WIPO | H03F 3/68 |

*Primary Examiner*—Robert Pascal
*Assistant Examiner*—Patricia T. Nguyen
*Attorney, Agent, or Firm*—Harold C. McGurk; Timothy J. Lorenz; Frank J. Bogacz

[57] ABSTRACT

A power amplifier uses a plurality of solid-state amplifiers (FIGS. 2 and 3, 140) arranged in a parallel manner to form a power amplifier module (10). Each solid-state amplifier is adhered to a low thermal expansion insert (130). The insert is then coupled to a low cost aluminum substrate in order to carry the excess heat from each solid-state amplifier (140) to the aluminum housing. The power outputs from the solid-state amplifiers from each module are combined with the power outputs from other modules using electroformed waveguide combiners (FIG. 1, 30, 40).

18 Claims, 4 Drawing Sheets

EFFICIENT SOLID-STATE HIGH FREQUENCY POWER AMPLIFIER STRUCTURE

TECHNICAL FIELD

The invention relates to the field of high frequency electronics and, more particularly, to techniques for high frequency amplification of signals using solid-state devices.

BACKGROUND OF THE INVENTION

In a satellite communication system, a network of satellites provides telecommunications services to terrestrial-based subscribers. In such a system, the satellites maintain communications with terrestrial-based gateways so that control and subscriber information can be exchanged. These gateways also provide an interface with terrestrial wireline switched telephone networks. Typically, the links that the satellites maintain with the terrestrial-based gateways are of a substantially high bandwidth. Therefore, the terrestrial-based gateways use high frequency microwave or millimeter wave frequencies in order to maintain the high bandwidth communications link with the orbiting satellite.

In a typical terrestrial-based gateway, a traveling wave tube is used to uplink the information to the satellite. A traveling wave tube can be selected for use in a terrestrial-based gateway due to its capability to provide high power signals. However, there are several disadvantages in using a traveling wave tube in a terrestrial-based gateway. One disadvantage of a traveling wave tube is relatively poor signal to noise performance. A second disadvantage of a traveling wave tube is that their use can often be cost prohibitive due to the inherent complexity and size. Other disadvantages of the use of a traveling wave tube is their comparatively low reliability, as well as the requirement for a large high voltage power supply required for tube amplifiers. These high voltage power supplies present safety issues for personnel who would repair the traveling wave tube, or who otherwise have a need to be in close contact with the traveling wave tube amplifier.

In a satellite communications system, it is also frequently desirable to provide different classes of service in the terrestrial-based gateway. Typically, these classes require power levels of between 10 and 100 watts of output power in accordance with the transmit data rates used in the gateway to satellite uplink. Therefore, in designing a network of terrestrial-based gateways, it is necessary to employ traveling wave tubes of varying size in order to provide the various output power levels.

In previous designs which make use of solid-state amplifiers having power outputs which are coupled to waveguide combiners, broad wall waveguide coupling is used. Additionally, the waveguiding structures incorporate no special means for increasing combining efficiency. Further, the designs are not optimized for low cost, high volume manufacturing environments.

Therefore, what is needed, is a low cost, high power, reliable solidstate high frequency amplifier for use as a traveling wave tube replacement. What is also needed, is a modular based high frequency power amplifier which can be used to support varying power output levels which can be used to provide classes of service in the terrestrial-based gateway.

DESCRIPTION OF THE PREFERRED EMBODIMENTS

An efficient modular solid-state high frequency power amplifier provides an improvement over a traveling wave tube. The modular design allows modules to be combined with other similar modules to create output power levels of approximately 20 Watts, for a single module, to approximately 160 watts for a combination of eight modules. Even higher output power levels can be achieved by combining additional modules. Further, improvements in output power can be realized through the use of higher power solid-state amplifier components as these components become available. The resulting design provides greater reliability, lower cost, and does not require a high voltage power supply.

Figure 1:
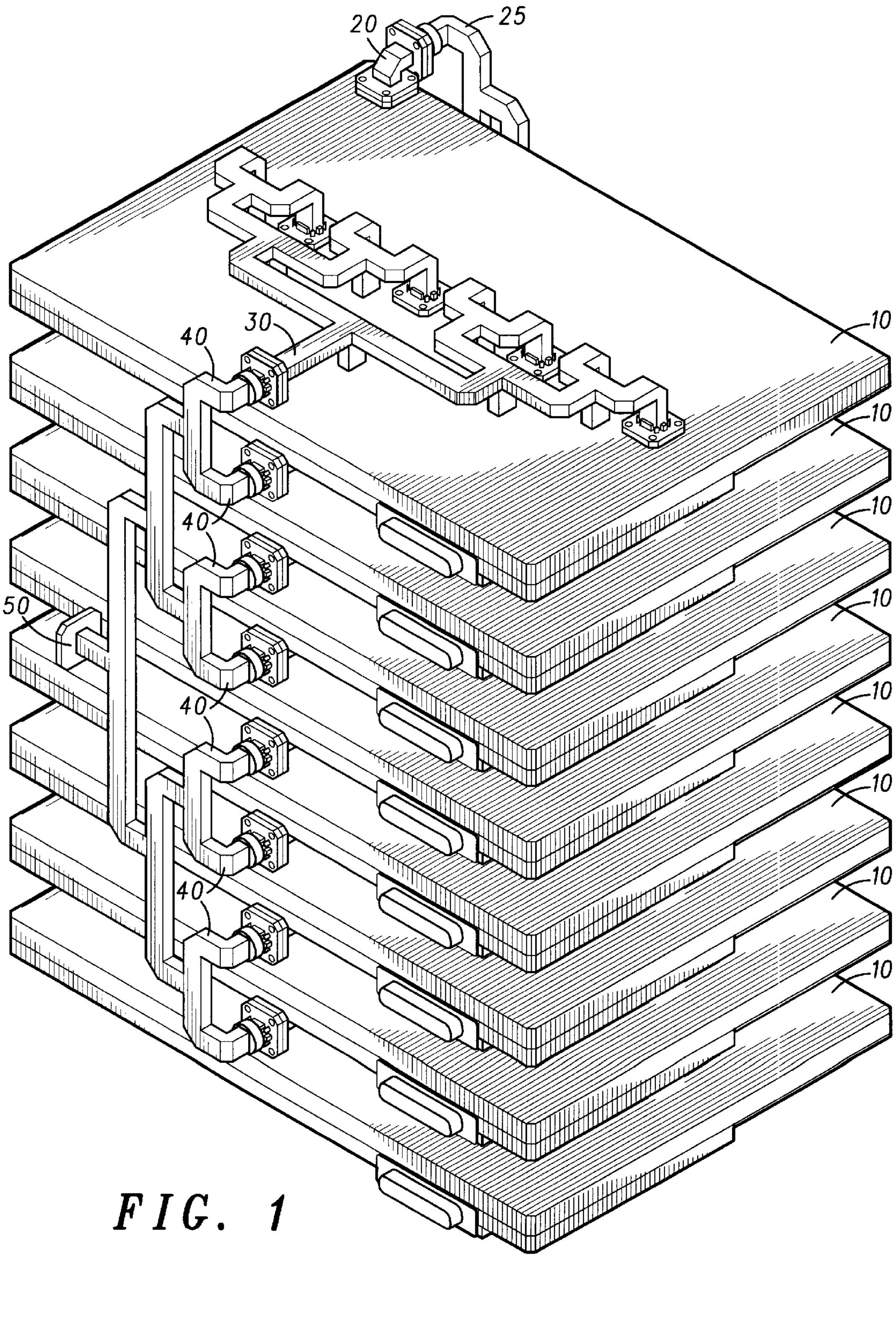
FIG. 1 illustrates an integrated modular solid-state high frequency power amplifier structure in accordance with a preferred embodiment of the invention.

FIG. 1 illustrates an integrated modular solid-state high frequency power amplifier structure in accordance with a preferred embodiment of the invention. In FIG. 1, eight modules 10 are combined to form approximately 160 Watt power amplifier. Each module 10 comprises eight solid-state amplifiers. The output of each solid-state amplifier is combined into a single output using amplifier power combiner 30. Each of the single outputs from amplifier power combiner 30 is coupled to module power combiner 40. Module power combiner 40 functions to combine the power outputs of each of modules 10 into combined output 50. Combined output 50 can be coupled to an external device such as a terrestrial-based transmit antenna. In an alternate embodiment, where the apparatus of FIG. 1 is used in a space-based application, combined output 50 can be coupled to a space-based transmit antenna.

In a preferred embodiment, amplifier power combiner 30 and module power combiner 40 are comprised of electroformed waveguides. Each of these waveguide combiners are comprised chiefly of copper, or other suitably conductive metal. In order to prevent corrosion of the internal walls of power combiners 30 and 40, a dry air purge can be used in order to remove humidity-laden air from power combiners 30 and 40. Through the use of a dry air purge, the conductive properties of power combiners 30 and 40 can be maintained at an acceptable level. In an alternative embodiment, power combiners 30 and 40 can be hermetically sealed in order to maintain a benign environment inside each power combiner.

Each of modules 10 is fed through module power splitter 25. Module power splitter 25 can be of a construction similar to that of module power combiner 40. Additionally, module power splitter 25 may include a means to prevent corrosion from humidity-laden air such as the dry air purge or hermetic sealing mentioned in reference to power combiners 30 and 40. Each output of module power splitter 25 is coupled to module power input 20, which provides coupling to each of modules 10. The individual solid-state amplifiers, which provide the basic signal amplification mechanism, lie on the reverse side of module 10, and are therefore not shown in FIG. 1.

Figure 2:
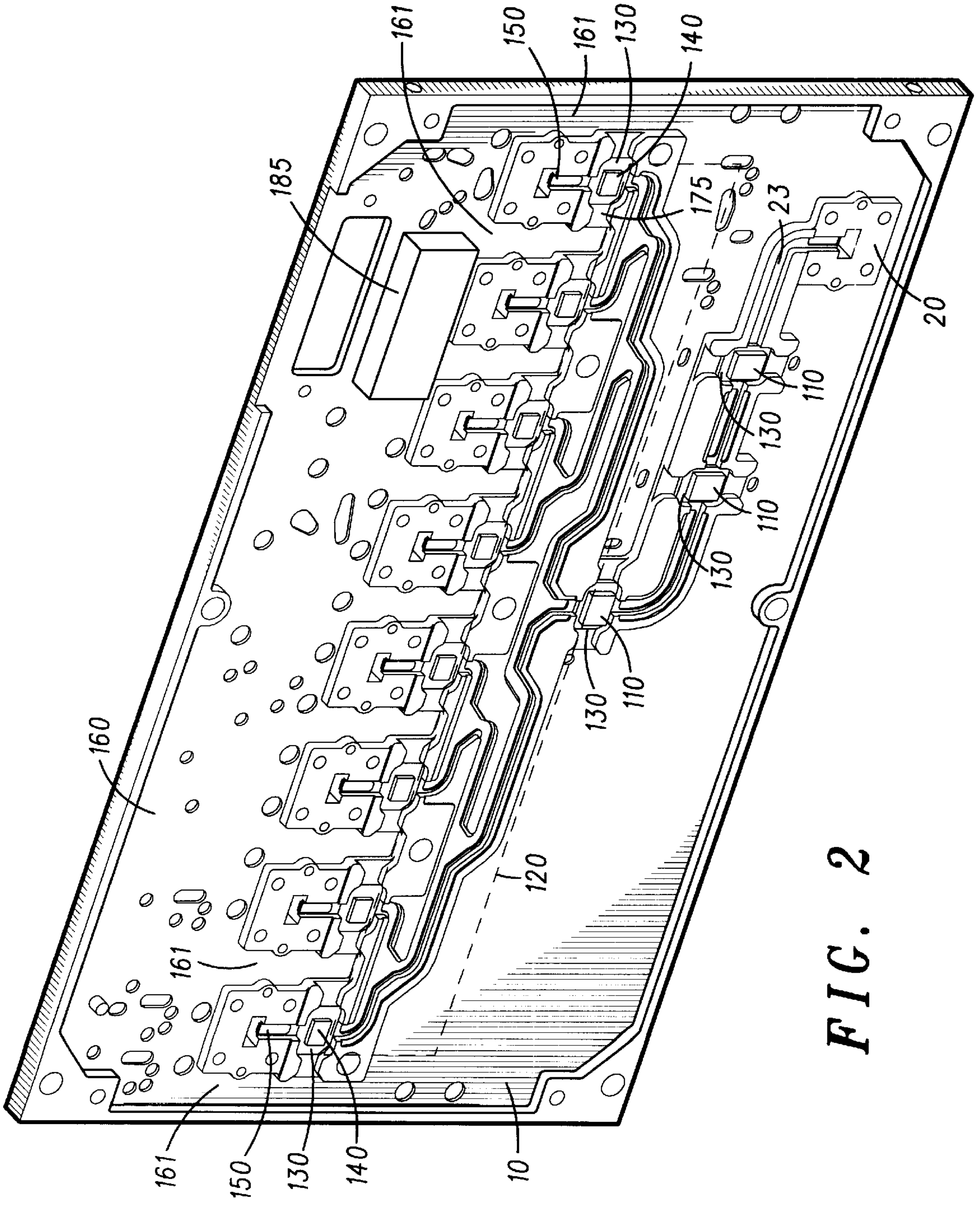
FIG. 2 illustrates a detailed layout of a high frequency power amplifier module in accordance with a preferred embodiment of the invention.

FIG. 2 illustrates a detailed layout of a high frequency power amplifier module in accordance with a preferred embodiment of the invention. The illustration of FIG. 2 shows the reverse side of module 10 of FIG. 1. The signal to the amplifier is coupled to module 10 through module power input 20. In a preferred embodiment, a microstrip electric field probe allows power to be coupled from module power input 20 to coupling path 23 according to conventional means. Coupling path 23 may be comprised mainly of suspended stripline using technology well known to those of skill in the art. In FIG. 2, the top cover of the suspended stripline power combiner has been removed in order to show the topography of coupling path 23. The details of the construction of the suspended stripline transmission line are discussed in reference to FIG. 4. Coupling path 23 conveys the input signal to driver amplifiers 110, which serve as an input amplification stage for the input signal prior to coupling the input signal to power divider 120.

In a preferred embodiment, power divider 120 is comprised also of suspended strip line transmission media. The selection of suspended strip line for power divider 120 stems mainly from the desirable loss properties of this type of transmission media. In an alternate embodiment, another transmission media can be used such as microstrip, or ordinary stripline. However, these alternate embodiments may not possess loss properties comparable to suspended stripline, but can be used in applications where the additional loss can be tolerated.

Each output from power divider 120 is coupled to one of solid-state amplifiers 140. In a preferred embodiment, each output of power divider 120 makes use of a transition to microstrip in order to allow coupling to solid-state amplifiers 140 in a straightforward manner. The output of each of solid-state amplifiers 140 is then coupled to an input of amplifier power combiner 30 through a microstrip to waveguide electric field probe according to conventional techniques. Although not shown in FIG. 2, each input of amplifier power combiner 30 is back-shorted also in accordance with conventional techniques.

Experience with module architectures similar to that of module 10 employing similar amplifier-to-waveguide coupling techniques indicates that each coupling results in approximately 0.6 dB of loss. Thus, when each of solid state amplifiers 140 produce 3.5 watts, the amount of power coupled into each input of amplifier power combiner 30 can be expected to be about 3.0 watts. Thus, 8 such inputs can be expected to produce over 20 watts of high frequency power at the output of amplifier power combiner 30, considering an additional 0.3 dB of loss within amplifier power combiner 30.

Module 10 also comprises direct current (DC) board 160, which conveys direct current power to each of solid-state amplifiers 140 through an interdigitated structure. As shown in FIG. 2, a plurality of interdigitated fingers 161 conveys DC power to within a short distance of each of the solid-state amplifiers 140. In a preferred embodiment, DC bias and rail voltages are provided through wire bonds from solid-state amplifiers 140 to one of interdigitated fingers 161. Additionally, the input signal from power divider 120 is coupled to solid-state amplifiers 140 through conventional wire bonds as well. Further, each of solid-state amplifiers 140 is coupled to output coupling path 150 a through wire bonds as well. In a preferred embodiment, the length and height of those wire bonds which carry high frequency signals to and from solid-state amplifiers 140, are desirably controlled in order to produce predictable stray parasitic inductance and capacitance. DC board 160 can also incorporate microprocessor 185 in order to monitor the performance and status of each of solid-state amplifiers 140, and to report this to a central resource manager.

In FIG. 2, each solid-state amplifier 140 lies on a low thermal expansion insert 130. The specific geometry of each low thermal expansion insert 130, as well as solid-state amplifiers 140, is described in greater detail in reference to FIG. 4. Low thermal expansion inserts 130 function as a thermally conductive media which carry excess heat generated by solid-state amplifiers 140 to aluminum substrate 175.

Figure 3:
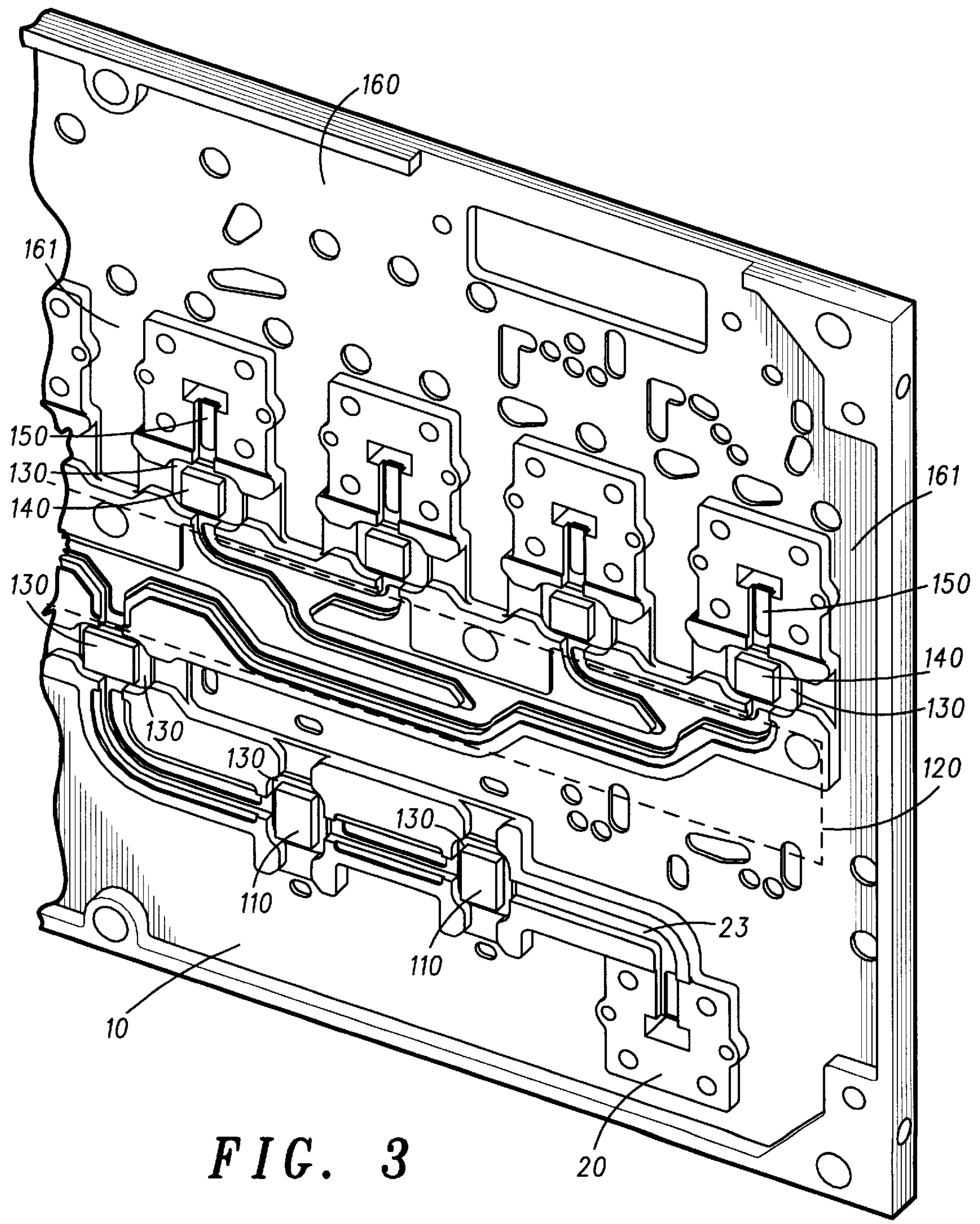
FIG. 3 illustrates a portion of the detailed layout of the high frequency power amplifier module of FIG. 2 in greater detail in accordance with a preferred embodiment of the invention.

FIG. 3 illustrates a portion of the detailed layout of the high frequency power amplifier module of FIG. 2 in greater detail in accordance with a preferred embodiment of the invention.

Although the modular high frequency amplifier structure shown in FIGS. 1, 2, and 3 show an ensemble of components, such as solid-state amplifiers 140, arranged in a linear fashion, this is not intended in be limiting in any way. The general layout of the components which populate module 10 can be altered in order to optimize space, or arranged in any particular dimension in accordance with other design constraints.

Figure 4:
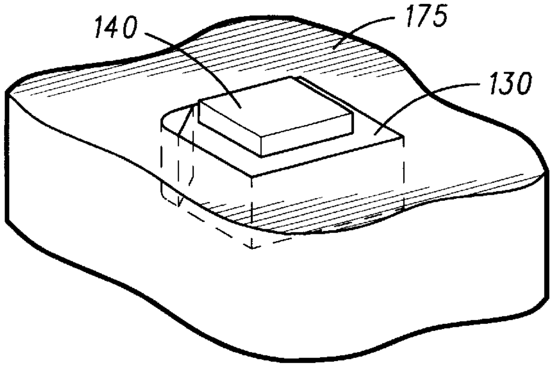
FIG. 4 illustrates a cutaway view of an individual solid-state amplifier mounted on a low thermal expansion insert in accordance with a preferred embodiment of the invention.

FIG. 4 illustrates a cutaway view of an individual solid-state amplifier mounted on a low thermal expansion insert 130. Low thermal expansion insert 130 has been pressed into substrate 175. In a preferred embodiment, solid-state amplifier 140, is affixed to low thermal expansion insert 130 using an epoxy-based adhesive. This method of adhering solid-state power amplifier 140 to low thermal expansion insert 130 is preferred in lieu of soldering since failed amplifiers can be removed without re-flowing solder. Therefore, replacements of solid-state amplifiers 140 can be effected without subjecting module 10 to the substantial heat which is required to remove and replace components which have been soldered in place. This, in turn, assures that when a particular component is removed and replaced, the integrity of the epoxy bonds of adjacent components is unaffected. This is in sharp contrast to the use of solder, where adjacent components must be inspected or replaced when a nearby circuit element has been resoldered.

Another positive aspect of the use of epoxy-based resin as an adherent for solid-state power amplifier 140 is the possibility of using automated epoxy-dispense and "pick-and-place" robotic assembly equipment. This further reduces the manufacturing costs associated with producing modules 10.

In a preferred embodiment, low thermal expansion insert 130 possesses similar thermal expansion characteristics as solid-state amplifier 140. Therefore, as thermal energy is conveyed from solid-state amplifier 140 to low thermal expansion insert 130, the two elements can expand and contract at similar rates. As the two materials expand and contract in concert, any shear stresses at the epoxy layer can be maintain at an acceptable level. Therefore, solid-state amplifier 140 can be expected to remain adhered to low thermal expansion insert 130 over a substantial number of temperature cycles. In a preferred embodiment, low thermal expansion insert 130 is comprised of a copper molybdenum alloy.

Although the selection of an epoxy resin as a means to adhere solidstate amplifier 140 to low thermal expansion insert 130 does not provide a mechanism for the transfer heat which is as effective as solder, this loss in thermal transfer efficiency is viewed as an acceptable trade-off. Additionally, as epoxy-based resins or other suitable adherents that possess improved thermal transfer characteristics become available, these can be used as well.

In a preferred embodiment, low thermal expansion insert 130 includes a notch at a corner of the insert. This notch provides means for prying low thermal expansion insert 130 from substrate 175 using standard tools. Additionally, low thermal expansion insert 130 can be plated with gold or silver in order to provide a corrosion resistant surface. By providing a corrosion resistant surface, it can be assured that maximum heat transfer from low thermal expansion insert 130 to the aluminum substrate is maintained.

Figure 5:
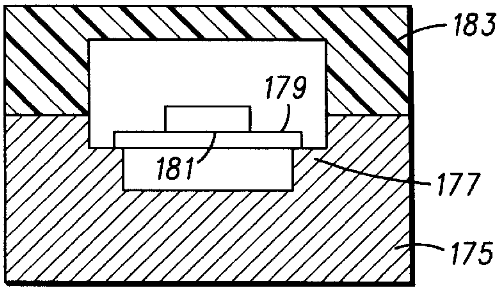
FIG. 5 illustrates a cross sectional view of a channel that has been milled into an aluminum substrate in accordance with a preferred embodiment of the invention.

FIG. 5 illustrates a cross sectional view of a channel that has been milled into an aluminum substrate 175 in accordance with a preferred embodiment of the invention. As shown in FIG. 5, the channel also incorporates ledge 177 on which dielectric material 179 is mounted. Dielectric material 179 can be comprised of any suitable commercial material, which possesses desirable dielectric and loss properties. In a preferred embodiment, Duroid is used, but other materials such as Teflon or Polyolefin may also be used. Conductor 181 is mounted on the reverse side of dielectric material 179 and is sized in accordance with conventional techniques. In a preferred embodiment, the area between dielectric material 179 and aluminum substrate 175 does not include a dielectric material. FIG. 5 also includes top cover 183 which forms the upper conductive surface.

Figure 6:
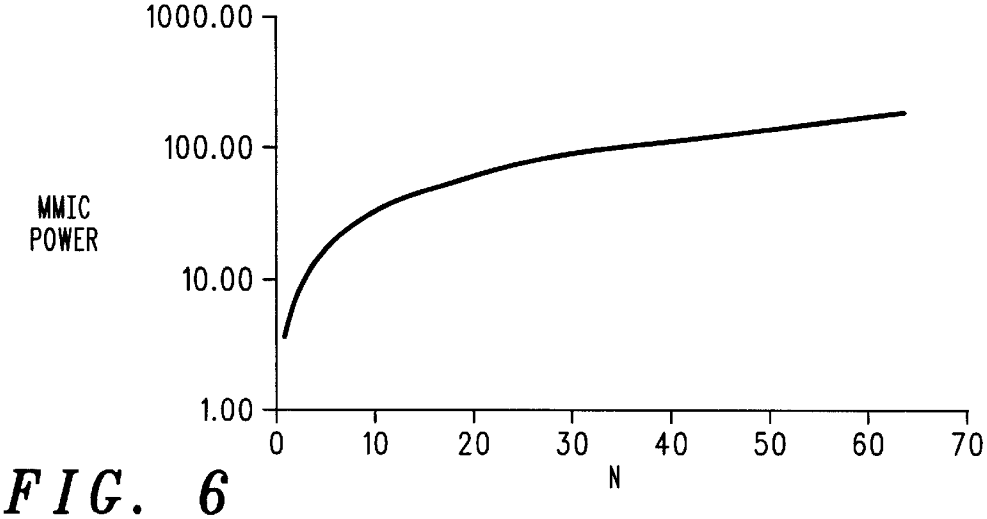
FIG. 6 illustrates a performance curve of the combiner efficiency of electroformed waveguide combiners such as those used for an amplifier power combiner, and a module power combiner in accordance with a preferred embodiment of the invention.

FIG. 6 illustrates a performance curve of the combiner efficiency of electroformed waveguide combiners such as those used for amplifier power combiner 30, and module power combiner 40 in accordance with a preferred embodiment of the invention. The horizontal axis of FIG. 6 represents the number (N) of solid-state amplifier devices which can be combined using the waveguide combiner technique discussed herein. The vertical axis of FIG. 6 represents the combined power output on a logarithmic scale. In general, the most efficient combinations occur when N is equal to 2 raised to an integer power, such as 8, 16, 32, and so on.

As can be seen from the curve of FIG. 6, a combination of eight modules, each of which includes eight solid-state power amplifiers, produces approximately 160 wafts of output power when 3.5 watt Gallium Arsenide (GaAs) pseudomorphic high electron mobility transistor devices are used. Although FIGS. 1, 2, and 3 describe an ensemble of 64 solid-state amplifiers 140 (FIGS. 2 and 3), more or less may be used according to the requirements of the particular application. For applications which involve the replacement of a traveling wave tube, an ensemble of 25 to 100 solid-state amplifiers should be sufficient.

The superior combiner efficiency which is characteristic of electroformed waveguide combiners is viewed as an important advantage of the present invention. The anticipated 96 percent combiner efficiency facilitates a power output which is comparable to a traveling wave tube of virtually any size by combining the outputs of a number of solid-state power amplifiers.

In summary, the present invention enables the generation of high power signals through the efficient combination of outputs of individual solid-state power amplifiers. The modules which comprise the solid-state power amplifiers can be combined to produce outputs which range from 20 watts for a single module, to approximately 160 watts for a combination of 8 modules with each module employing 3.5 watt GaAs pseudomorphic high electron mobility transistor devices. Higher power outputs can be realized through the combination of a larger number of modules, or the selection of constituent solid-state amplifier components which possess higher power outputs.

While the principles of the invention have been described above in connection with a specific apparatus, it is to be clearly understood that this description is made only by way of example and not as a limitation of the scope of the invention. Accordingly, it is intended by the appended claims to cover all modifications of the method and system of the present invention that fall within the true spirit and scope of the invention.

What is claimed is:

1. A high frequency amplifier, comprising:

a substrate;

a plurality of solid-state amplifiers each coupled to said substrate;

an electroformed waveguide combiner having a plurality of inputs and a combined output, each of said plurality of inputs being coupled to said substrate in order to receive a power output from each of said plurality of solid-state amplifiers; and an interdigitated stucture for conveying direct current power to said plurality of solid-state amplifiers.

2. The high frequency amplifier of claim 1, further comprising an electric field probe which couples said power output from each of said plurality of solid-state amplifiers to said plurality of inputs of said electroformed waveguide combiner.

3. The high frequency amplifier of claim 1, further comprising a thermally conductive media by which said plurality of solid-state amplifiers are coupled to said substrate.

4. The high frequency amplifier of claim 3, further comprising an epoxy based adhesive used to adhere each of said plurality of solid-state amplifiers to said thermally conductive media.

5. The high frequency amplifier of claim 3, wherein said thermally conductive media possesses thermal characteristics similar to the thermal characteristics of said plurality of solid-state amplifiers.

6. The high frequency amplifier of claim 3, wherein said thermally conductive media is plated with a layer of gold.

7. The high frequency amplifier of claim 3, wherein said thermally conductive media is plated with a layer of silver.

8. The high frequency amplifier of claim 1, wherein said substrate is substantially comprised of aluminum.

9. The high frequency amplifier of claim 1, wherein said plurality of solid-state amplifiers are comprised of Gallium Arsenide transistor devices.

10. The high frequency amplifier of claim 9, wherein said plurality of solid-state amplifiers are comprised of pseudomorphic high electron mobility transistor devices.

11. The high frequency amplifier of claim 1 additionally comprising an input amplification stage coupled to said plurality of solid-state amplifiers through a power divider.

12. The high frequency amplifier of claim 11, wherein said power divider comprises a channel milled into said substrate to form a suspended stripline transmission line.

13. A modular high frequency amplifier, comprising:

a plurality of modules, wherein each of said plurality of modules comprises a plurality of solid-state amplifiers arranged in a particular dimension, and wherein each of said plurality of modules additionally comprises a module power combiner and a microprocessor which reports status of said plurality of solid-state amplifiers; and an amplifer power combiner having a plurality of inputs, wherein each of said plurality of inputs is coupled to a corresponding of said module power combiner.

14. The modular high frequency amplifier of claim 13, wherein said amplifier power combiner is comprised of an electroformed waveguide.

15. The modular high frequency amplifier of claim 13, wherein said amplifier power combiner comprises a number of inputs equal to 2 raised to an integer power.

16. The modular high frequency amplifier of claim 13, further comprising an external antenna.

17. The modular high frequency amplifier of claim 16, wherein said external antenna is a terrestrial-based transmit antenna.

18. The modular high frequency amplifier of claim 16, wherein said external antenna is a space-based transmit antenna.

* * * * *